(12) United States Patent
Liu

(10) Patent No.: US 11,411,201 B2
(45) Date of Patent: Aug. 9, 2022

(54) FLEXIBLE ORGANIC LIGHT EMITTING DIODE DISPLAY PANEL INCLUDING SOFT METAL DOPED INORGANIC LAYERS

(71) Applicant: WUHAN CHINA STAR OPTOELECTRONICS SEMICONDUCTOR DISPLAY TECHNOLOGY CO., LTD., Hubei (CN)

(72) Inventor: Wei Liu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 260 days.

(21) Appl. No.: 16/623,963

(22) PCT Filed: Aug. 7, 2019

(86) PCT No.: PCT/CN2019/099586
§ 371 (c)(1),
(2) Date: Dec. 18, 2019

(87) PCT Pub. No.: WO2020/237830
PCT Pub. Date: Dec. 3, 2020

(65) Prior Publication Data
US 2021/0408453 A1    Dec. 30, 2021

(30) Foreign Application Priority Data

May 30, 2019  (CN) .......................... 201910465745.8

(51) Int. Cl.
*H01L 51/00*  (2006.01)
*H01L 51/50*  (2006.01)
(Continued)

(52) U.S. Cl.
CPC ...... *H01L 51/5253* (2013.01); *H01L 27/3244* (2013.01); *H01L 51/0097* (2013.01);
(Continued)

(58) Field of Classification Search
CPC ............ H01L 51/5253; H01L 51/0097; H01L 51/5237; H01L 51/5088; H01L 51/5056;
(Continued)

(56) References Cited

U.S. PATENT DOCUMENTS

2017/0005292 A1  1/2017 Lee et al.
2018/0175310 A1  6/2018 Lee et al.
(Continued)

FOREIGN PATENT DOCUMENTS

CN   107910349 A   4/2018
CN   109686865 A   4/2019

*Primary Examiner* — Ida M Soward

(57) ABSTRACT

A flexible organic light emitting diode display panel includes a substrate, a first inorganic layer, an organic layer, and a second inorganic layer. The first inorganic layer doped with copper or silver and is disposed on the substrate. A doping concentration of copper or silver in the first inorganic layer is 8-40 atom percent. The organic layer is disposed on the first inorganic layer. The second inorganic layer is doped with copper or silver and is disposed on the organic layer. A doping concentration of copper or silver in the second inorganic layer is 8-40 atom percent.

4 Claims, 1 Drawing Sheet

(51) Int. Cl.
  *H01L 51/52* (2006.01)
  *H01L 27/32* (2006.01)
  *G09F 9/30* (2006.01)
  *H01L 51/56* (2006.01)

(52) U.S. Cl.
  CPC .......... *H01L 51/56* (2013.01); *H01L 51/5056* (2013.01); *H01L 51/5088* (2013.01); *H01L 51/5096* (2013.01); *H01L 51/5256* (2013.01); *H01L 2227/323* (2013.01); *H01L 2251/301* (2013.01); *H01L 2251/5338* (2013.01); *H01L 2251/558* (2013.01)

(58) Field of Classification Search
  CPC ............. H01L 51/5256; H01L 51/5096; H01L 2251/301; H01L 2251/5338; H01L 2251/558; H01L 27/3244; G09F 9/301
  See application file for complete search history.

(56) References Cited

U.S. PATENT DOCUMENTS

| | | | |
|---|---|---|---|
| 2019/0131559 A1* | 5/2019 | Kwon | H01L 51/002 |
| 2020/0091457 A1* | 3/2020 | Yu | H01L 51/5246 |
| 2020/0243785 A1 | 7/2020 | Yin | |
| 2020/0335726 A1* | 10/2020 | Lee | H01L 51/5237 |
| 2020/0381664 A1* | 12/2020 | Bae | B32B 27/302 |
| 2021/0083224 A1* | 3/2021 | Yoo | H01L 51/5253 |

\* cited by examiner

FLEXIBLE ORGANIC LIGHT EMITTING DIODE DISPLAY PANEL INCLUDING SOFT METAL DOPED INORGANIC LAYERS

FIELD OF INVENTION

The present disclosure relates to a field of display technology, and particularly to a flexible organic light emitting diode display panel and a method for fabricating the same.

BACKGROUND

Flexible display devices are future development trend of display technology.

Thin film encapsulation (TFE) technology can eliminate a need for a rigid glass cover plate for organic light emitting diode (OLED) display devices and enable flexible bending of OLED display devices. Therefore, among various encapsulation technologies, thin film encapsulation technology is widely used.

In general, thin film encapsulation technology uses a multilayer encapsulation structure of organic layer/inorganic layer to protect OLED devices. The inorganic layer can effectively prevent invasion of water and oxygen, thereby prolonging a service life of an OLED display panel. The organic layer can make a diffusion path of water and oxygen invading into OLED devices discontinuous and can eliminate stress. However, the inorganic layer in the multilayer encapsulation structure cannot withstand excessive stress, so the inorganic layer is still easily fractured during bending of the display panel. Fracture of the inorganic layer will affect encapsulation effect of the encapsulation structure.

Therefore, it is necessary to provide a flexible organic light emitting diode display panel and a method for fabricating the same to solve the problem in the prior art.

SUMMARY OF DISCLOSURE

It is a purpose of the present disclosure to provide a flexible organic light emitting diode display panel and a method for fabricating the same to solve the technical problem, in the prior art, that bending performance of flexible organic light emitting diode display panels cannot be further improved.

In order to solve the above problem, the present disclosure provides a flexible organic light emitting diode display panel. The display panel comprises a substrate, a first inorganic layer doped with a soft metal, an organic layer, and a second inorganic layer doped with the soft metal. The substrate comprises a flexible substrate, a thin film transistor array and an organic light emitting diode device stacked in sequence from bottom to top. The first inorganic layer doped with a soft metal is disposed on the substrate. The organic layer is disposed on the first inorganic layer. The second inorganic layer doped with the soft metal is disposed on the organic layer.

In the flexible organic light emitting diode display panel according to an embodiment of present disclosure, the organic layer is composed of an acrylic resin or an epoxy resin, the first inorganic layer doped with the soft metal and the second inorganic layer doped with the soft metal are composed of an inorganic material and the soft metal, and the soft metal is nickel, copper, or silver.

In the flexible organic light emitting diode display panel according to an embodiment of present disclosure, the inorganic material is $SiN_x$, $SiO_x$, $SiON_x$, $SiCN_x$, $Al_2O_3$, or any combination thereof.

In the flexible organic light emitting diode display panel according to an embodiment of present disclosure, doping concentrations of the soft metal in the first inorganic layer and the second inorganic layer are 8-40 atom percent.

In the flexible organic light emitting diode display panel according to an embodiment of present disclosure, thicknesses of the first inorganic layer and the second inorganic layer are 0.5-1 mm, and a thickness of the organic layer is 3-8 mm.

The present disclosure further provides a method for fabricating a flexible organic light emitting diode display panel. The method comprises:

providing a substrate comprising a flexible substrate, a thin film transistor array and an organic light emitting diode device stacked in sequence from bottom to top;

forming a first inorganic layer doped with a soft metal on the substrate;

forming an organic layer on the first inorganic layer; and forming a second inorganic layer doped with the soft metal on the organic layer.

In the method for fabricating the flexible organic light emitting diode display panel according to an embodiment of present disclosure, the organic layer is composed of an acrylic resin or an epoxy resin, the first inorganic layer doped with the soft metal and the second inorganic layer doped with the soft metal are composed of an inorganic material and the soft metal, and the soft metal is nickel, copper, or silver.

In the method for fabricating the flexible organic light emitting diode display panel according to an embodiment of present disclosure, the inorganic material is $SiN_x$, $SiO_x$, $SiON_x$, $SiCN_x$, $Al_2O_3$, or any combination thereof.

In the method for fabricating the flexible organic light emitting diode display panel according to an embodiment of present disclosure, doping concentrations of the soft metal in the first inorganic layer and the second inorganic layer are 8-40 atom percent.

In the method for fabricating the flexible organic light emitting diode display panel according to an embodiment of present disclosure, thicknesses of the first inorganic layer and the second inorganic layer are 0.5-1 mm, and a thickness of the organic layer is 3-8 mm.

Compared with the prior art, the flexible organic light emitting diode display panel provided by the disclosure and the method for fabricating the same improve toughness of the inorganic layers of the thin film encapsulation structure by doping the soft metal into the inorganic layers. Therefore, the inorganic layers of the thin film encapsulation structure are not easily fractured during bending of the display panel, thereby improving bending performance of the flexible organic light emitting diode display panel.

DETAILED DESCRIPTION

Figure 1:
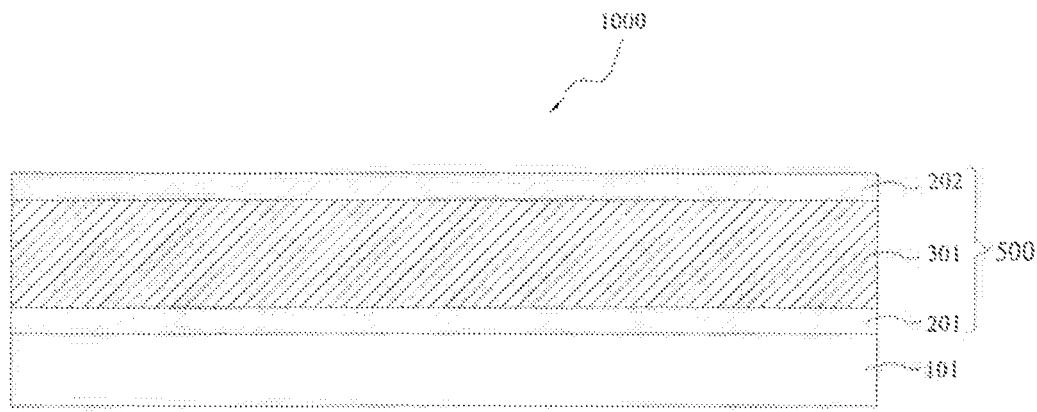
FIG. 1 is a cross-sectional side view of a flexible organic light emitting diode display panel according to an embodiment of the present disclosure.

The following description of various embodiments of the present disclosure with reference to the accompanying drawings is used to illustrate specific embodiments that can be practiced. Directional terms mentioned in the present disclosure, such as "above", "below", "front", "rear", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structures are indicated by the same reference numerals.

The present disclosure provides a flexible organic light emitting diode display panel, which will be described in detail below.

Please refer to FIG. 1, which is a cross-sectional side view of a flexible organic light emitting diode display panel according to an embodiment of the present disclosure.

The flexible organic light emitting diode display panel 1000 comprises a substrate 101, a first inorganic layer 201 doped with a soft metal, an organic layer 301, and a second inorganic layer 202 doped with the soft metal. The first inorganic layer 201 doped with the soft metal is disposed on the substrate 101. The organic layer 301 is disposed on the first inorganic layer 201. The second inorganic layer 202 doped with the soft metal is disposed on the organic layer 301.

In order to make the display panel 1000 flexible, the substrate 101 comprises a flexible substrate, a thin film transistor array and an organic light emitting diode (OLED) device stacked in sequence from bottom to top (not shown). The flexible substrate is composed of a flexible material such as polyimide (PI) and polyethylene terephthalate (PET). The OLED device mainly comprises an anode, a hole injection layer, a hole transport layer, an electron blocking layer, a light emitting layer, an electron transport layer, an electron injection layer, a cathode, an optical coupling-out layer, and a lithium fluoride (LiF) layer in this order from bottom to top. A thin film transistor array is constructed to switch on/off the OLED device. The thin film transistor array can form an electric field between the anode and the cathode, thereby injecting holes from the anode through the hole injection layer and the hole transport layer to the light emitting layer, and injecting electrons from the cathode through the electron injection layer and the electron transport layer to the light emitting layer. The holes and electrons combine in the light emitting layer to emit visible light. The optical coupling-out layer is composed of a organic small molecule hole material, which can reduce a loss of light inside the OLED device, thereby improving luminous efficiency of the OLED device. The lithium fluoride (LiF) layer can protect the OLED device from damage during a subsequent formation of thin film encapsulation layer.

The first inorganic layer 201 is disposed on the substrate 101. That is, the first inorganic layer 201 is directly formed on the lithium fluoride (LiF) layer. Alternatively, in other embodiments, the OLED device may not comprise the lithium fluoride (LiF) layer or the optical coupling-out layer, such that the first inorganic layer 201 is formed directly on the optical coupling-out layer or cathode.

The first inorganic layer 201, the organic layer 301 and the second inorganic layer 202 constitute a thin film encapsulation layer 500. The thin film encapsulation layer 500 is constructed to protect the OLED device from physical scratches and to prevent foreign matter from intruding into the OLED device.

The organic layer 301 is composed of an acrylic resin or an epoxy resin. Such organic material can make a diffusion path of water and oxygen invading into OLED devices discontinuous and can eliminate stress.

The first inorganic layer 201 doped with the soft metal and the second inorganic layer 202 doped with the soft metal are composed of an inorganic material and the soft metal. the inorganic material is $SiN_x$, $SiO_x$, $SiON_x$, $SiCN_x$, $Al_2O_3$, or any combination thereof. The inorganic material in the first inorganic layer 201 doped with the soft metal and the second inorganic layer 202 doped with the soft metal can effectively prevent invasion of water and oxygen, thereby prolonging service life of an OLED display panel.

According to the present disclosure, an inorganic layer doped with a soft metal is obtained by performing thin film deposition using the soft metal and an inorganic material as a starting material. The soft metal may be nickel, copper, or silver. By doping the inorganic layer with the soft metal, toughness of the inorganic layer can be improved. Effect of doping nickel to enhance the toughness of the inorganic layer is most remarkable. Since a diffusion rate of soft metal atoms in a medium is fast, in a thin film deposition process of forming the first inorganic layer 201 doped with the soft metal and the second inorganic layer 202 doped with the soft metal, the soft metal atoms can diffuse very quickly to boundaries of grains and inhibit growth of the grains. Therefore, the inorganic layer doped with the soft metal has a smaller grain size than an inorganic layer not doped with the soft metal. This size effect can improve the toughness of the finally formed inorganic layer. Because the toughness of the inorganic layers of the thin film encapsulation structure is improved, the inorganic layers of the thin film encapsulation structure are not easily fractured during bending of the display panel, thereby improving bending performance of the flexible organic light emitting diode display panel.

Furthermore, as content of a soft metal in an inorganic layer increases, toughness of the inorganic layer also increases. In order to improve the toughness of the inorganic layer and achieve good water and oxygen barrier effects, conditions of the thin film deposition process may be controlled such that doping concentrations of the soft metal in the first inorganic layer 201 and the second inorganic layer 202 are 8-40 atom percent, thicknesses of the first inorganic layer 201 and the second inorganic layer 202 are 0.5-1 mm, and a thickness of the organic layer 301 is 3-8 mm. Such a soft metal doping concentration range and thickness range enable the first inorganic layer 201 and the second inorganic layer 202 to effectively prevent water and oxygen intrusion and make the first inorganic layer 201 and the second inorganic layer 202 tough and not easily broken.

Figure 2:
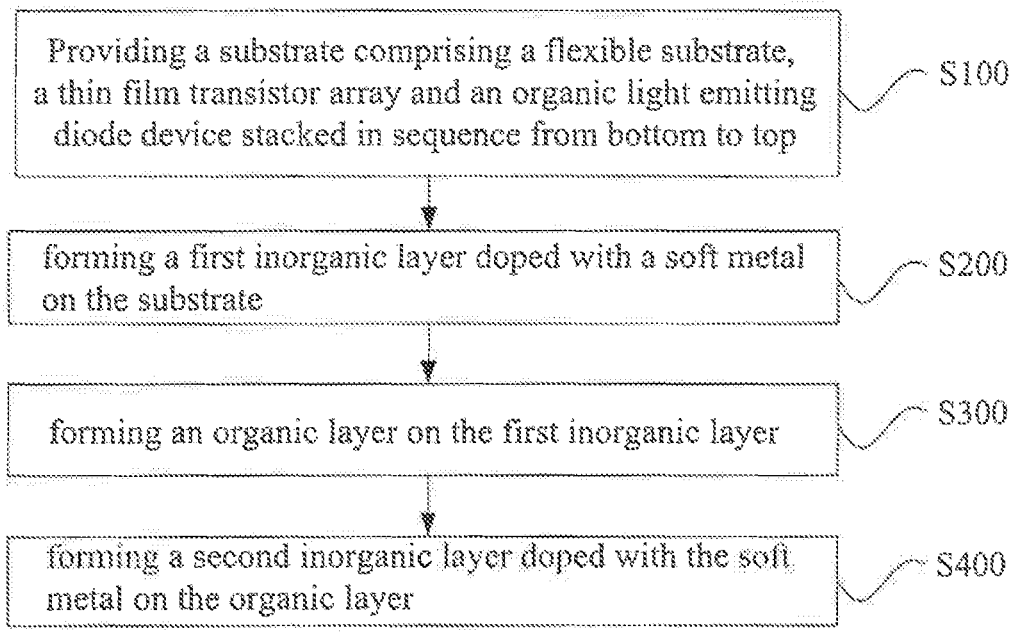
FIG. 2 is a flowchart of a method for fabricating a flexible organic light emitting diode display panel according to an embodiment of the present disclosure.

Please refer to FIG. 2, which is a flowchart of a method for fabricating a flexible organic light emitting diode display panel according to an embodiment of the present disclosure. The present disclosure further provides a method for fabricating a flexible organic light emitting diode display panel 1000. The method is used to fabricate the flexible organic light emitting diode display panel as shown in FIG. 1. The method comprises following steps.

Step S100: providing a substrate 101 comprising a flexible substrate, a thin film transistor array and an organic light emitting diode device stacked in sequence from bottom to top.

In order to make the display panel 1000 flexible, the substrate 101 comprises a flexible substrate, a thin film transistor array and an organic light emitting diode (OLED) device stacked in sequence from bottom to top (not shown). The flexible substrate is composed of a flexible material such as polyimide (PI) and polyethylene terephthalate (PET). The OLED device mainly comprises an anode, a hole injection layer, a hole transport layer, an electron blocking layer, a light emitting layer, an electron transport layer, an electron injection layer, a cathode, an optical coupling-out layer, and a lithium fluoride (LiF) layer in this order from bottom to top. A thin film transistor array is constructed to switch on/off the OLED device. The thin film transistor array can form an electric field between the anode and the cathode, thereby injecting holes from the anode through the hole injection layer and the hole transport layer to the light emitting layer, and injecting electrons from the cathode through the electron injection layer and the electron transport layer to the light emitting layer. The holes and electrons combine in the light emitting layer to emit visible light. The optical coupling-out layer is composed of a organic small molecule hole material, which can reduce a loss of light inside the OLED device, thereby improving luminous efficiency of the OLED device. The lithium fluoride (LiF) layer can protect the OLED device from damage during a subsequent formation of thin film encapsulation layer.

Step S200: forming a first inorganic layer 201 doped with a soft metal on the substrate 101.

Specifically, the first inorganic layer 201 doped with the soft metal is obtained by performing thin film deposition, such as magnetron sputtering, using the soft metal and an inorganic material as a starting material. The inorganic material is $SiN_X$, $SiO_X$, $SiON_X$, $SiCN_X$, $Al_2O_3$, or any combination thereof.

Conditions of the thin film deposition process may be controlled such that a doping concentration of the soft metal in the first inorganic layer 201 is 8-40 atom percent, and a thickness of the first inorganic layer 201 is 0.5-1 mm.

Step S300: forming an organic layer 301 on the first inorganic layer 201.

Specifically, the organic layer 301 may be formed by chemical vapor deposition (CVD). The organic layer 301 is composed of an acrylic resin or an epoxy resin. Such organic material can make a diffusion path of water and oxygen invading into OLED devices discontinuous and can eliminate stress.

Step S400: forming a second inorganic layer 202 doped with the soft metal on the organic layer 301.

Specifically, the second inorganic layer 202 doped with the soft metal is obtained by performing thin film deposition, such as magnetron sputtering, using the soft metal and the inorganic material as a starting material. The inorganic material is $SiN_X$, $SiO_X$, $SiON_X$, $SiCN_X$, $Al_2O_3$, or any combination thereof. Conditions of the thin film deposition process may be controlled such that a doping concentration of the soft metal in the second inorganic layer 202 is 8-40 atom percent, and a thickness of the second inorganic layer 202 is 0.5-1 mm.

Compared with the prior art, the flexible organic light emitting diode display panel provided by the disclosure and the method for fabricating the same improve toughness of the inorganic layers of the thin film encapsulation structure by doping the soft metal into the inorganic layers. Therefore, the inorganic layers of the thin film encapsulation structure are not easily fractured during bending of the display panel, thereby improving bending performance of the flexible organic light emitting diode display panel.

In the above, the present application has been described in the above preferred embodiments, but the preferred embodiments are not intended to limit the scope of the present application, and those skilled in the art may make various modifications without departing from the scope of the present application. The scope of the present application is determined by claims.

What is claimed is:

1. A flexible organic light emitting diode display panel, comprising:
    a substrate;
    a first inorganic layer doped with copper or silver and disposed on the substrate, wherein a doping concentration of copper or silver in the first inorganic layer is 8-40 atom percent;
    an organic layer disposed on the first inorganic layer; and
    a second inorganic layer doped with copper or silver and disposed on the organic layer, wherein a doping concentration of copper or silver in the second inorganic layer is 8-40 atom percent.

2. The flexible organic light emitting diode display panel according to claim 1, wherein the organic layer is composed of an acrylic resin or an epoxy resin, and the first inorganic layer and the second inorganic layer are composed of an inorganic material and copper or silver.

3. The flexible organic light emitting diode display panel according to claim 2, wherein the inorganic material is $SiN_X$, $SiO_X$, $SiON_X$, $SiCN_X$, $Al_2O_3$, or any combination thereof.

4. The flexible organic light emitting diode display panel according to claim 1, wherein thicknesses of the first inorganic layer and the second inorganic layer are 0.5-1 mm, and a thickness of the organic layer is 3-8 mm.

* * * * *